United States Patent
DeRosa et al.

(10) Patent No.: US 9,354,670 B2
(45) Date of Patent: May 31, 2016

(54) APPARATUS AND METHOD FOR PIVOT ATTACHMENT

(71) Applicant: General Electric Company, Schenectady, NY (US)

(72) Inventors: Joshua Paul David DeRosa, Auburn, NY (US); Richard A. Monroe, Syracuse, NY (US); Gerard Frederick Beckhusen, Baldwinsville, NY (US); Nicholas Anthony Stancato, Syracuse, NY (US); Clark Alexander Bendall, Syracuse, NY (US)

(73) Assignee: General Electric Company, Schenectady, NY (US)

( * ) Notice: Subject to any disclaimer, the term of this patent is extended or adjusted under 35 U.S.C. 154(b) by 274 days.

(21) Appl. No.: 13/975,947

(22) Filed: Aug. 26, 2013

(65) Prior Publication Data

US 2015/0055281 A1    Feb. 26, 2015

(51) Int. Cl.
| | |
|---|---|
| G06F 1/16 | (2006.01) |
| H05K 5/02 | (2006.01) |
| H01M 2/10 | (2006.01) |
| H05K 5/00 | (2006.01) |

(52) U.S. Cl.
CPC ............ *G06F 1/1683* (2013.01); *G06F 1/1615* (2013.01); *G06F 1/1632* (2013.01); *H01M 2/10* (2013.01); *H05K 5/0086* (2013.01); *H05K 5/02* (2013.01)

(58) Field of Classification Search
CPC ... G06F 1/1615; G06F 1/1622; G06F 1/1662; G06F 1/1683
USPC ............. 361/679.08–679.17, 679.55, 679.56; 340/636.1
See application file for complete search history.

(56) References Cited

U.S. PATENT DOCUMENTS

| | | | | |
|---|---|---|---|---|
| 4,734,710 A | * | 3/1988 | Sato et al. | 347/171 |
| 4,808,021 A | * | 2/1989 | Kelly | 400/717 |
| 5,057,676 A | * | 10/1991 | Komaki | 235/375 |
| 5,371,348 A | * | 12/1994 | Kumar et al. | 235/472.02 |
| 5,583,744 A | * | 12/1996 | Oguchi et al. | 361/679.58 |
| 5,745,340 A | * | 4/1998 | Landau | 345/2.1 |
| 5,796,576 A | * | 8/1998 | Kim | 361/679.28 |
| 5,805,415 A | * | 9/1998 | Tran et al. | 361/679.09 |
| 6,007,939 A | | 12/1999 | Clowers | |

(Continued)

OTHER PUBLICATIONS

GE Measurement & Control Solutions; XLG3 Video Probe, Inspection Technologies, 2011, 16 pages.

(Continued)

*Primary Examiner* — Adrian S Wilson
(74) *Attorney, Agent, or Firm* — Barclay Damon, LLP

(57) ABSTRACT

A modular device and method are disclosed. The modular device includes individual modular units. A first modular unit includes a pivot member and a connector and a second modular unit includes a matching connector and a first mating point. The first mating point is configured to fit a portion of the pivot member. A third modular unit may also be included, where the third modular unit has a second mating point which is configured to fit another portion of the pivot member. The matched connectors align and connect when the second modular unit is rotated about the pivot member into contact with the first modular unit. The third modular unit can also be rotated about the same pivot member with or without the second modular unit connected. The second and third modular units can be rotated independently and/or removed independently.

18 Claims, 15 Drawing Sheets

(56) References Cited

U.S. PATENT DOCUMENTS

| | | | |
|---|---|---|---|
| 6,099,097 A * | 8/2000 | Hocker et al. | 312/327 |
| 6,106,457 A * | 8/2000 | Perkins et al. | 600/175 |
| 6,191,941 B1 * | 2/2001 | Ito et al. | 361/679.27 |
| 6,272,717 B1 | 8/2001 | Saraydar | |
| 6,307,740 B1 * | 10/2001 | Foster et al. | 361/679.1 |
| 6,317,315 B1 * | 11/2001 | Lee et al. | 361/679.29 |
| 6,385,039 B1 * | 5/2002 | Chiang et al. | 361/679.09 |
| 6,385,041 B1 * | 5/2002 | Choi | 361/679.41 |
| 6,411,503 B1 * | 6/2002 | Kambayashi et al. | 361/679.41 |
| 6,456,488 B1 * | 9/2002 | Foster et al. | 361/679.1 |
| 6,503,005 B1 * | 1/2003 | Cockerill et al. | 400/88 |
| 6,512,670 B1 * | 1/2003 | Boehme et al. | 361/679.29 |
| 6,644,611 B1 * | 11/2003 | Tai | 248/292.13 |
| 6,656,626 B1 * | 12/2003 | Mooty et al. | 429/99 |
| 6,670,808 B2 | 12/2003 | Nath et al. | |
| 6,697,764 B2 | 2/2004 | Corby, Jr. et al. | |
| 6,768,637 B1 * | 7/2004 | Amemiya | 361/679.55 |
| 6,890,196 B2 * | 5/2005 | Vila | 439/165 |
| 6,894,893 B2 * | 5/2005 | Hidesawa | 361/679.55 |
| 7,186,117 B2 * | 3/2007 | Chen | 439/11 |
| 7,306,386 B2 * | 12/2007 | Lyman et al. | 400/88 |
| 7,626,814 B2 * | 12/2009 | Seibert et al. | 361/679.45 |
| 7,902,990 B2 * | 3/2011 | Delmonico et al. | 340/636.1 |
| 8,072,427 B2 * | 12/2011 | Pletikosa et al. | 345/169 |
| 8,100,440 B2 * | 1/2012 | Yu | 292/5 |
| 8,189,043 B2 * | 5/2012 | Schneider et al. | 348/82 |
| 8,217,646 B2 * | 7/2012 | Karpen | 324/228 |
| 8,276,989 B2 | 10/2012 | Rogers et al. | |
| 8,310,604 B2 * | 11/2012 | Delmonico et al. | 348/748 |
| 8,343,115 B2 | 1/2013 | Lynch et al. | |
| 8,368,749 B2 | 2/2013 | Lambdin et al. | |
| D679,616 S * | 4/2013 | Sun | D10/78 |
| 8,693,181 B2 * | 4/2014 | Tseng et al. | 361/679.27 |
| 8,840,544 B2 * | 9/2014 | Hosaka et al. | 600/131 |
| D727,179 S * | 4/2015 | Stancato et al. | D10/46 |
| D727,756 S * | 4/2015 | Stancato et al. | D10/46 |
| 2005/0129108 A1 | 6/2005 | Bendall et al. | |
| 2005/0186985 A1 * | 8/2005 | Im et al. | 455/550.1 |
| 2006/0133021 A1 * | 6/2006 | Fan | 361/683 |
| 2006/0272725 A1 * | 12/2006 | Sherman et al. | 138/99 |
| 2008/0152417 A1 * | 6/2008 | Heaton et al. | 400/693 |
| 2009/0009955 A1 * | 1/2009 | Motoe | 361/685 |
| 2009/0162742 A1 * | 6/2009 | Aikawa et al. | 429/100 |
| 2009/0190295 A1 * | 7/2009 | Chin et al. | 361/679.27 |
| 2010/0271771 A1 * | 10/2010 | Wu et al. | 361/679.17 |
| 2010/0277858 A1 * | 11/2010 | Zhou | 361/679.17 |
| 2011/0122556 A1 * | 5/2011 | Cheng et al. | 361/679.01 |
| 2013/0027527 A1 * | 1/2013 | Scott et al. | 348/61 |
| 2015/0053025 A1 * | 2/2015 | Coombs et al. | 73/866.5 |

OTHER PUBLICATIONS

GE Measurement & Control, XL Go+ Video Probe, Inspection Technologies, 2012, 16 pages.

* cited by examiner

APPARATUS AND METHOD FOR PIVOT ATTACHMENT

BACKGROUND OF THE INVENTION

The subject matter disclosed herein relates to attachment of modular components.

Modular devices include hand held devices, which have multiple components. For example, a hand held drill may include a modular power supply which may be removed and replaced. When attaching components, proper alignment ensures the components mate properly. If mating is attempted without proper alignment, the components may not work properly and various elements (such as electrical connector pins) may be damaged.

This section is intended to provide a background or context. The description may include concepts that could be pursued, but are not necessarily ones that have been previously conceived or pursued. Unless otherwise indicated, what is described in this section is not prior art to the description and claims in this application and is not admitted to be such by inclusion in this section.

BRIEF DESCRIPTION OF THE INVENTION

An exemplary modular device includes individual modular units, such as, a handset unit, a sensor unit, a battery unit, etc. for example. A first modular unit includes a pivot member and an electrical connector and a second modular unit includes a matching electrical connector and a first mating point. The first mating point fits a portion of the pivot member. A third modular unit may also be included, where the third modular unit has a second mating point which fits another portion of the pivot member. The matched electrical connectors align and connect when the second modular unit is rotated about the pivot member into contact with the first modular unit. The third modular unit can also be rotated about the same pivot member with or without the second modular unit connected. The second and third modular units can be rotated independently and/or removed independently. An advantage that may be realized in the practice of some disclosed embodiments is an exemplary modular device which aligns connectors using rotational motion and enables selective rotation/removal of individual modular units. This allows the initial alignment to be performed quickly and easily using the pivot rod while the final alignment as the units come together is precise and assisted by the shrouds and housing geometries of the modular units.

An aspect of an exemplary embodiment provides an apparatus for selectively attaching/detaching individual modular units of the modular device using rotational motion. The apparatus includes a first modular unit (such as a hand set unit) having a pivot member and a first connector. The apparatus also includes a second modular unit (such as an inspection unit or a battery unit) having a second connector and a first mating point. The first mating point is configured to fit a first portion of the pivot member. The second connector is configured to align with the first connector when the second modular unit is rotated about an axis of rotation defined by the pivot member into contact with the first modular unit.

A further aspect of exemplary embodiment provides a method for selectively attaching/detaching individual modular units of the modular device using rotational motion. The method includes linking a first modular unit (such as a hand set unit) and a second modular unit (such as a battery unit) using a pivot member. The first modular unit includes a first connector and the second modular unit includes a second connector. The second modular unit is rotated about an axis of rotation defined by the pivot member into contact with the first modular unit. The second connector is configured to align with the first connector when the second modular unit is rotated about the axis of rotation defined by the pivot member into contact with the first modular unit. The method also includes linking a third modular unit (such as an inspection unit) using the pivot member. The third modular unit includes a third connector and the first modular unit also includes a fourth connector. The third modular unit is rotated about the axis of rotation defined by the pivot member into contact with the first modular unit. The third connector is configured to align with the fourth connector when the third modular unit is rotated about the axis of rotation defined by the pivot member into contact with the first modular unit. The second modular unit and the third modular unit are configured to be independently removable.

Another aspect of an exemplary embodiment provides an apparatus for selectively attaching/detaching from a modular device using rotational motion. The apparatus (such as a hand set unit, an inspection unit or a battery unit) includes a mating point configured to fit a first portion of a pivot member connected to a modular device and a first connector configured to align with a second connector on the modular device when the apparatus is rotated about an axis of rotation defined by the pivot member into contact with the modular device.

This brief description of the invention is intended only to provide a brief overview of subject matter disclosed herein according to one or more illustrative embodiments, and does not serve as a guide to interpreting the claims or to define or limit the scope of the invention, which is defined only by the appended claims. This brief description is provided to introduce an illustrative selection of concepts in a simplified form that are further described below in the detailed description. This brief description is not intended to identify key features or essential features of the claimed subject matter, nor is it intended to be used as an aid in determining the scope of the claimed subject matter. The claimed subject matter is not limited to implementations that solve any or all disadvantages noted in the background. The brief description is intended to be merely exemplary and non-limiting.

BRIEF DESCRIPTION OF THE DRAWINGS

So that the manner in which various features of the invention can be understood, a detailed description may be had by reference to certain embodiments, some of which are illustrated in the accompanying drawings. It is to be noted, however, that the drawings illustrate only certain embodiments and are therefore not to be considered limiting of its scope, for the scope of the invention encompasses other equally effective embodiments. The drawings are not necessarily to scale, emphasis generally being placed upon illustrating the features of certain embodiments. In the drawings, like numerals are used to indicate like parts throughout the various views. Thus, for further understanding, reference can be made to the following detailed description, read in connection with the drawings in which.

DETAILED DESCRIPTION OF THE INVENTION

Various exemplary embodiments serve to align connectors using rotational motion and to enable selective rotation/removal of individual modular units, or sub-assemblies, of a composite device. As a non-limiting example, a pivot member, such as a pivot rod for example, provides a common axis of rotation for two or more individual modular units. Each individual modular unit is configured to align with another modular unit when brought into contact using a rotational motion. By ensuring the proper alignment, the individual modular units can be easily attached and connectors on the individual modular units may be mated with reduced risk of damage. The individual modular units may also be attached and/or removed independently of other modular units so that a single modular unit may be replaced without forcing the user to disassemble the composite device.

Figure 1:
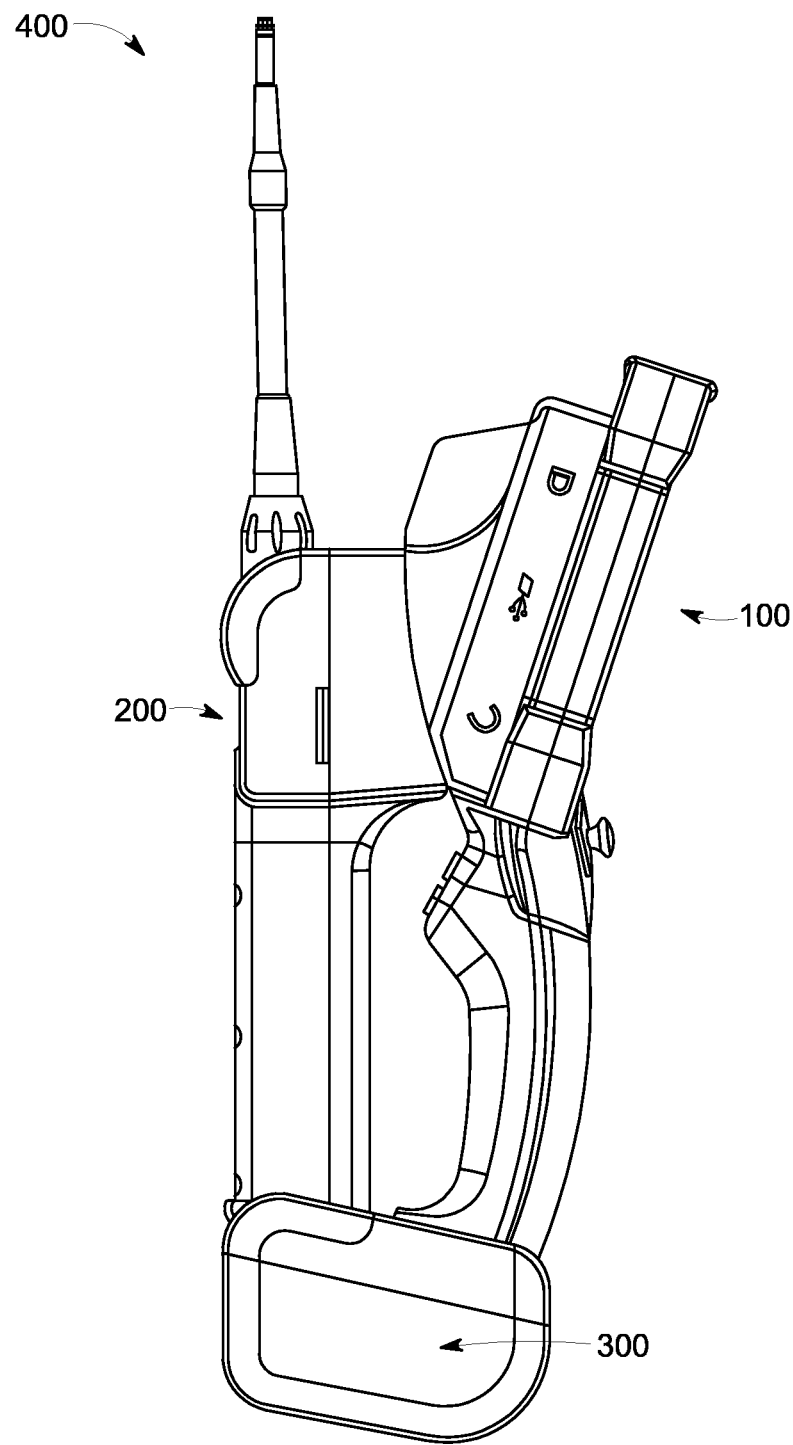
FIG. 1 illustrates a first attached configuration of three modular units in accordance with an exemplary embodiment.

FIG. 1 illustrates a first attached configuration 400 of three modular units 100, 200, 300 in accordance with an exemplary embodiment. The three modular units 100, 200, 300 are modular units and may be connected and disconnected by a user as desired. In this non-limiting embodiment, the first modular unit is a handset unit 100, the second modular unit is an inspection unit 200 and the third modular unit is a battery unit 300.

Figure 4:
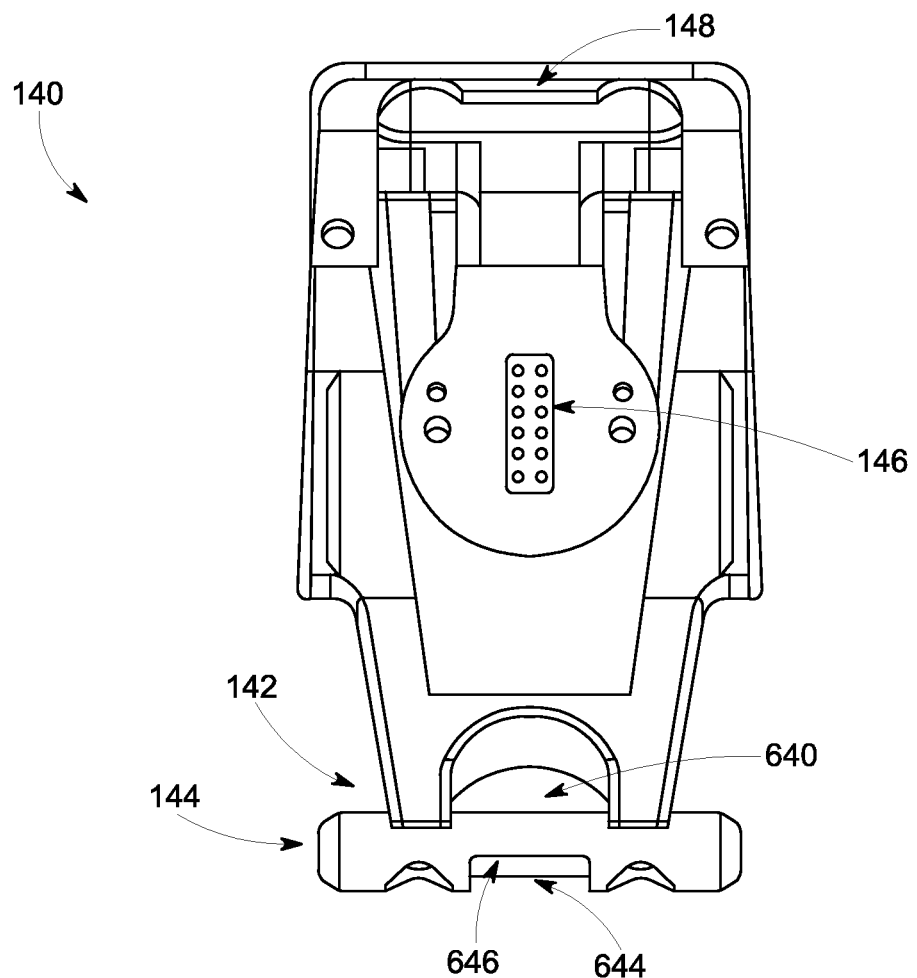
FIG. 4 shows a mounting plate of the first modular unit in accordance with the exemplary embodiment.

The inspection unit 200 is shown as a sensor unit (see FIG. 4). However, inspection unit 200 could also be embodied as a probe unit, an illuminating unit, an imaging unit, a tool unit, a radar unit, a radiography unit, a detecting unit, a processing unit or a digital communication unit, as non-limiting examples.

Due to their modular design, individual modular units 100, 200, 300 may be removed and replaced with different (or even identical) modular units. For example, the battery unit 300 may be removed and replaced with a second battery unit, such as when the first battery unit 300 is depleted. Alternatively, the battery unit 300 could be removed and replaced with a plug-in power supply (or wired connection to an alternative battery such as on a user's belt).

Figure 2:
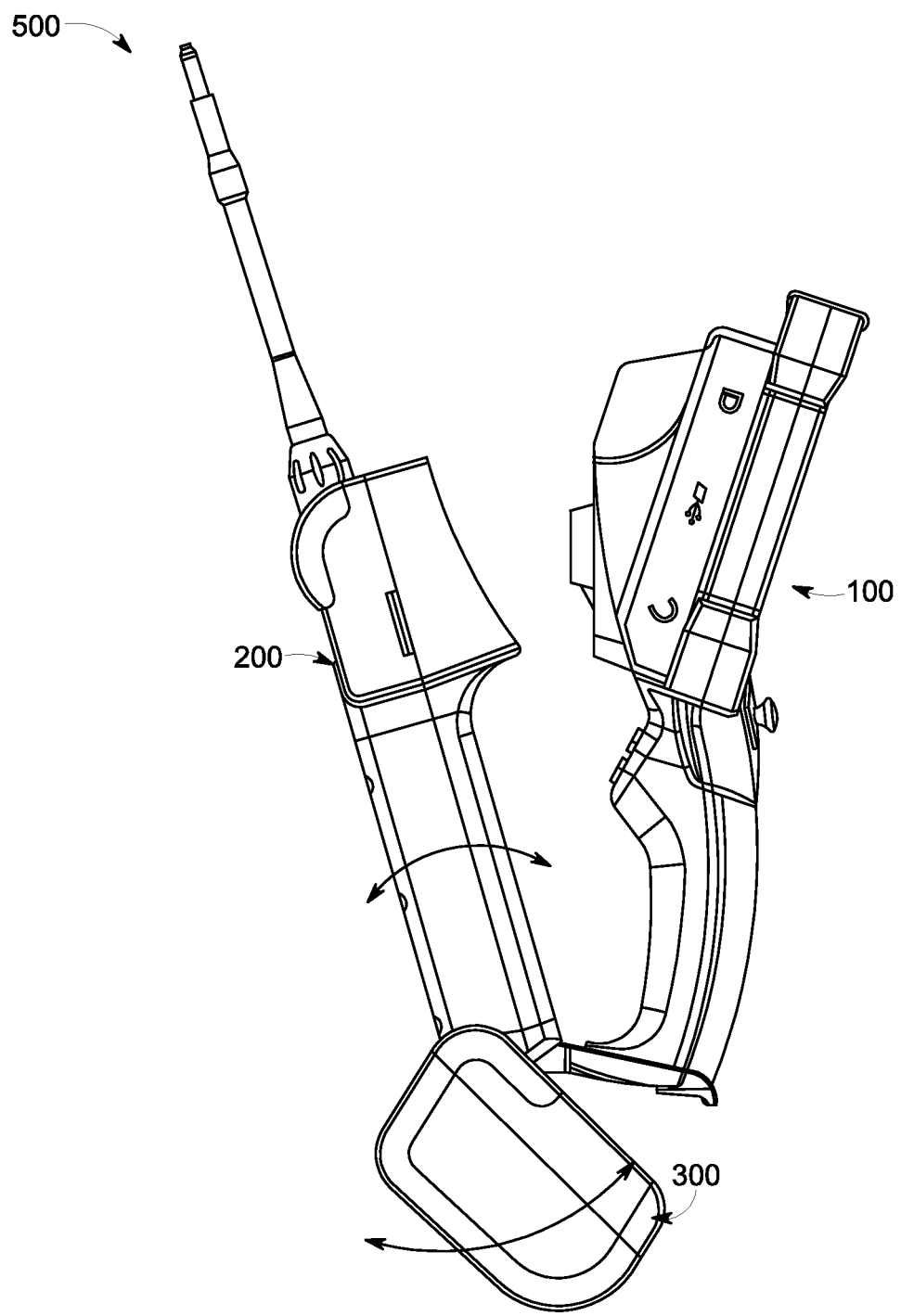
FIG. 2 illustrates a first free pivoting configuration of the three modular units in accordance with the exemplary embodiment.

FIG. 2 illustrates a first free pivoting configuration 500 of the three modular units 100, 200, 300 in accordance with the exemplary embodiment. As shown, the inspection unit 200 and the battery unit 300 are free to rotate around a common axis that is normal to the plane of the image. The inspection unit 200 and the battery unit 300 are able to independently rotate about the axis, to be connected to the handset unit 100 or to be removed from the combination. While the rotation of modular units 200, 300 is described in relation to a non-moving handset unit 100, this is for description reasons only. From a different perspective, the handset unit 100 is also free to rotate about the same axis.

Figure 3:
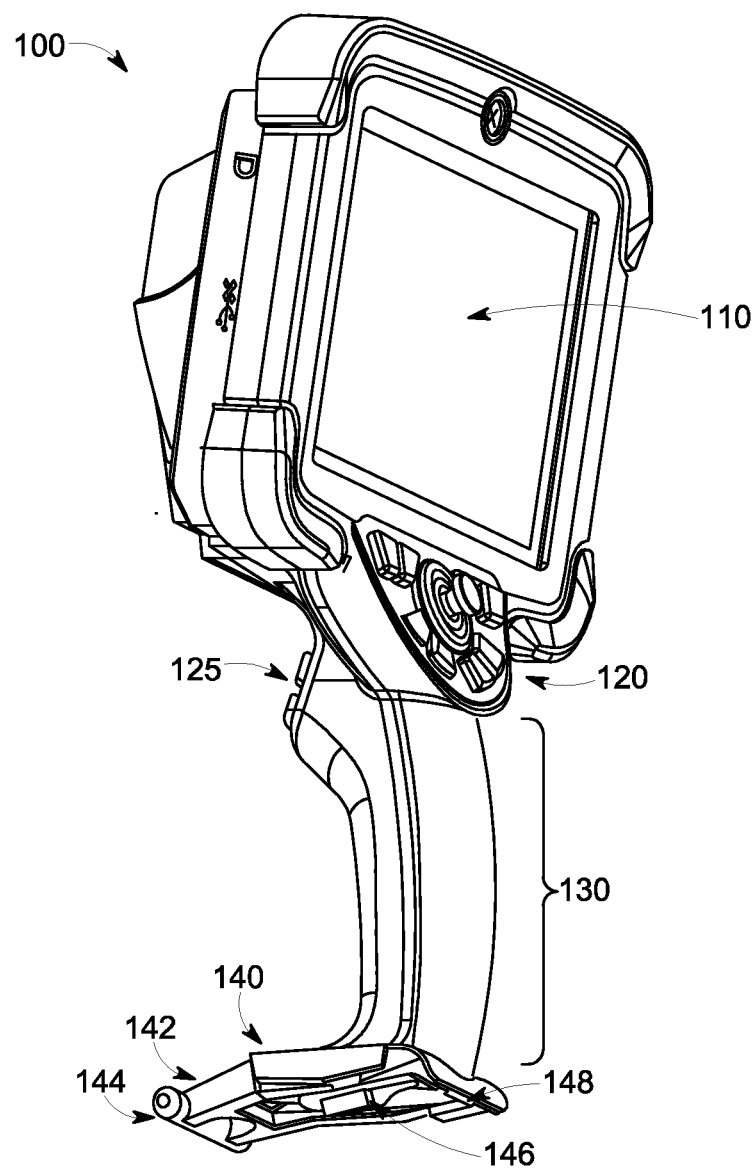
FIG. 3 shows a first modular unit in accordance with the exemplary embodiment.

FIG. 3 shows the handset unit 100 in accordance with the exemplary embodiment. The handset unit 100 includes output, such as display 110, and input, such as control pad input 120 and trigger input 125. The handset unit 100 may also include a computer processor (not shown) and memory (not shown).

The display 110 is at one end of the handset unit 100, the first end, while on the other end, the second end, is a mounting plate 140 with a handle 130 spanning the space between. The mounting plate 140 includes a mounting plate support 142 which holds a pivot rod 144 (or cylindrical pivot bar). An electrical connector, such as second connector 146, and a mechanical connector, such as second latch catch 148, are also located on the mounting plate 140.

Figure 6:
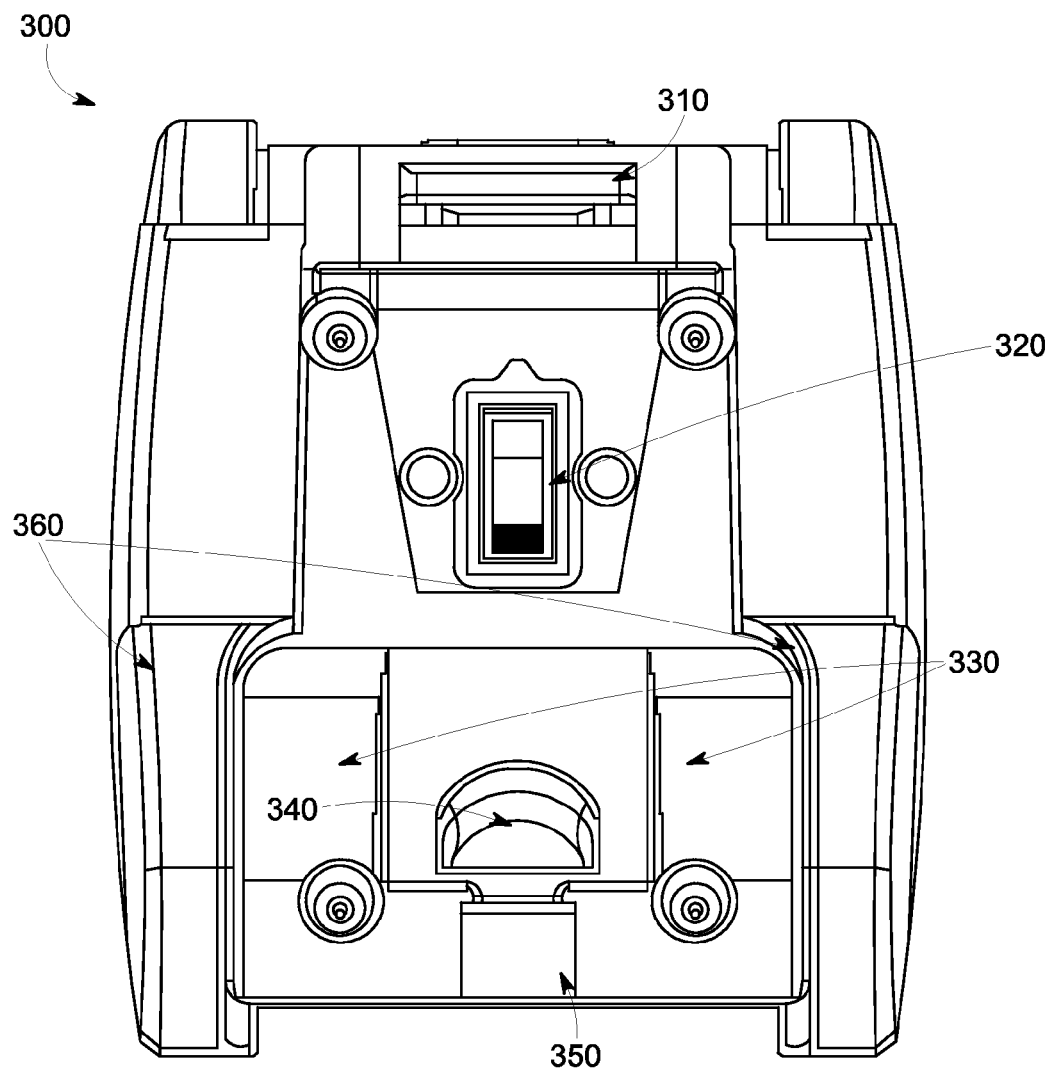
FIG. 6 shows a third modular unit in accordance with the exemplary embodiment.

In this non-limiting embodiment, the mounting plate 140 provides connectors for making connections with the battery unit 300. The second connector 146 is configured to mate with a second matching connector 320 on the battery unit 300 and the second latch catch 148 is configured to mate with a second latch 310 on the battery unit 300 as shown in FIG. 6.

FIG. 4 shows another view of the mounting plate 140 of the handset unit 100 in accordance with the exemplary embodiment. The mounting plate support 142 includes a mounting plate opening 640 such that various portions of the pivot rod 144 are exposed. The pivot rod 144 is generally cylindrical, as a non-limiting example. As shown, the pivot rod 144 includes a pivot rod slot 644 revealing a pivot rod slot surface 646. In this non-limiting embodiment, the mounting plate opening 640 provides additional space for both the inspection unit 200 and the battery unit 300 to engage with the pivot rod 144.

Figure 5:
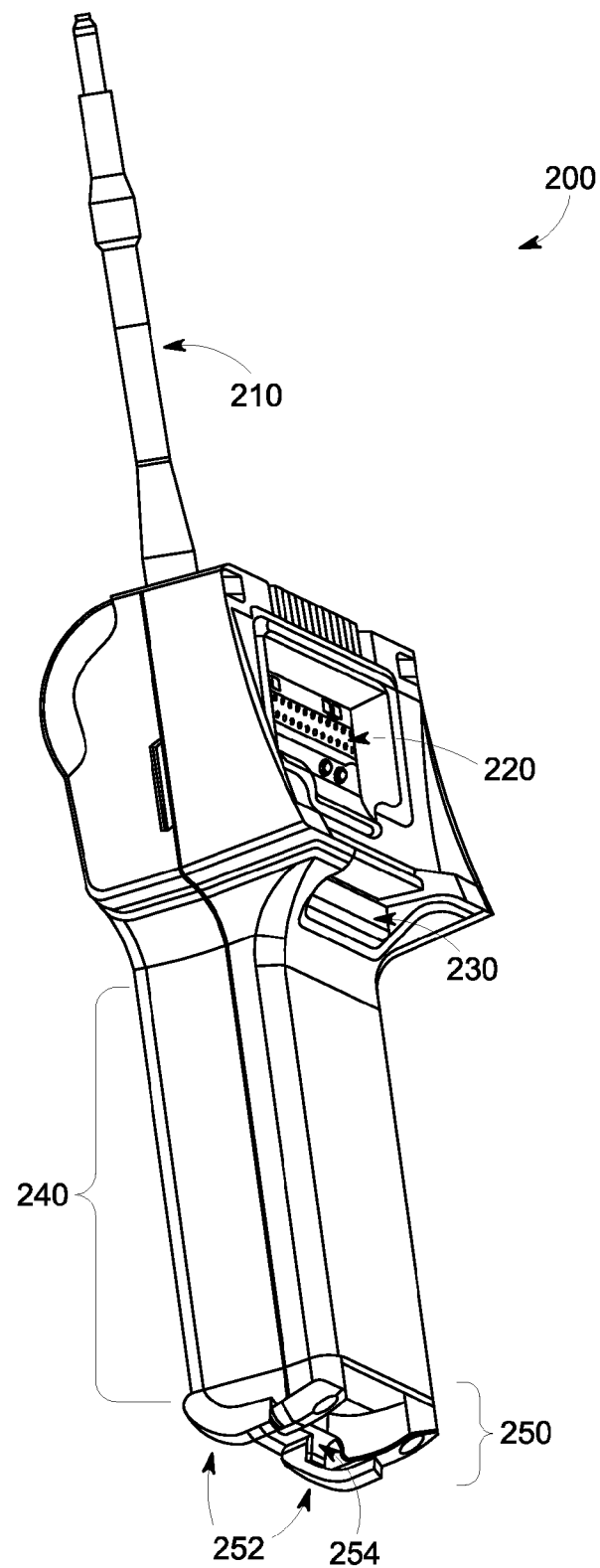
FIG. 5 shows a second modular unit in accordance with the exemplary embodiment.

FIG. 5 shows the inspection unit 200 in accordance with the exemplary embodiment. The inspection unit 200 includes a sensor 210 which the handset unit 100 can control when connected to the inspection unit 200. The inspection unit 200 may connect with the handset unit 100 using an electrical connector, such as first matching connector 220, and a mechanical connector, such as first latch 230. The first matching connector 220 matches a first connector 820 shown in FIG. 8 and the first latch 230 mates with a first latch catch 830, also shown in FIG. 8.

The inspection unit 200 also includes an extension 240 with a portion of the inspection unit 200, the receiver 250, at one end. The receiver 250 provides a mating point for the pivot rod 144 where the pivot rod 144 is received. As shown, the pivot rod guides 252 provide a pivot rod seat 254 which accepts the pivot rod 144 when the inspection unit 200 is rotated about the pivot rod 144 and connected to the handset unit 100. The pivot rod guides 252 also provide surfaces perpendicular to the ends of the pivot rod 144 which prevent the pivot rod 144 from moving laterally.

FIG. 6 shows the battery unit 300 in accordance with the exemplary embodiment. The battery unit 300 includes a mechanical connector, such as the second latch 310, which is configured to mate with the second latch catch 148 of the handset unit 100 (as shown in FIGS. 3 and 4). An electrical connector, such as second matching connector 320, is configured to mate with the second connector 146 (as shown in FIGS. 3 and 4).

A hook 340 and stop 350 provide a mating point for the pivot rod 144. The hook 340 is concentrically/concave shaped to receive the pivot rod 144. The pivot rod 144 is configured to be mated with the hook 340 and stop 350 when the battery unit 300 is connected to the handset unit 100 or rotated about the pivot rod 144. The stop 350 locks the battery unit 300 in place in all orientations when the battery unit 300 is latched to the handset unit 100, as described further in reference to FIGS. 11-12.

The battery unit 300 also includes modular unit guides 360 which define a modular unit seat 330. The modular unit seat 330 provides a space (or spaces) where a portion of the inspection unit 200 may be disposed when both the inspection unit 200 and the battery unit 300 are mated with the pivot rod 144.

Figure 7:
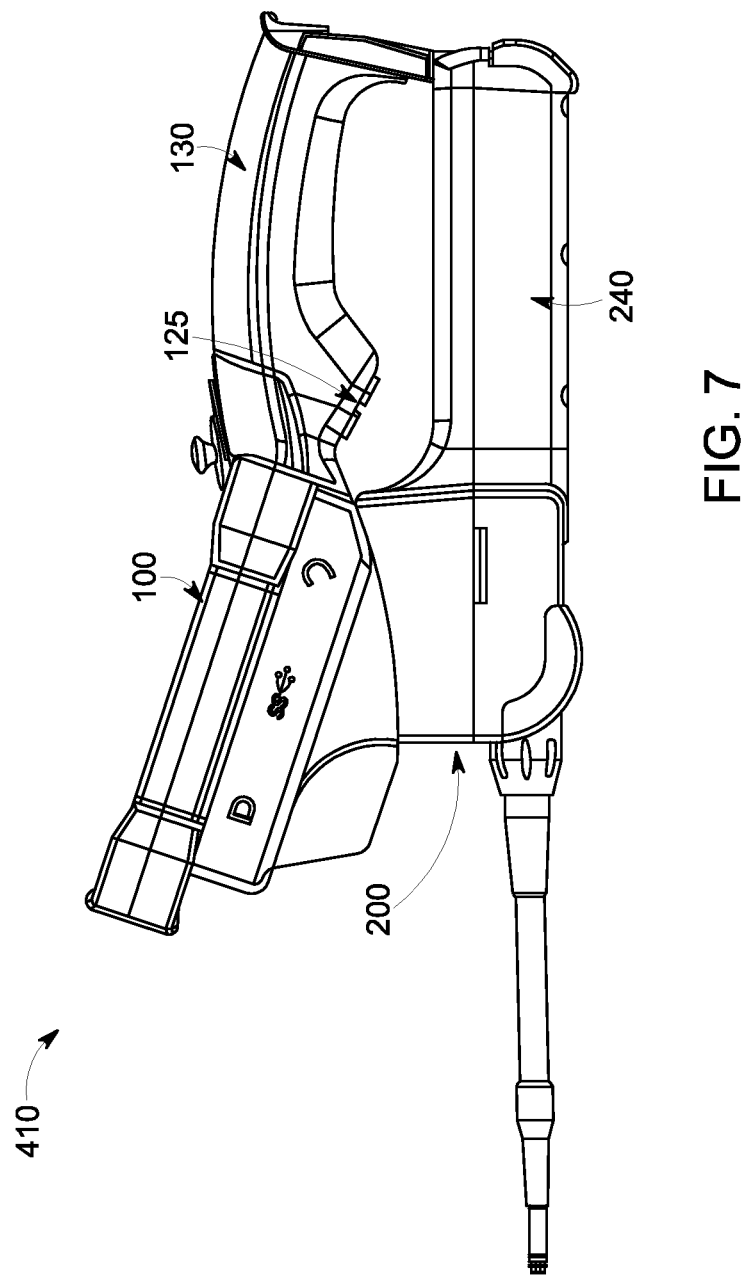
FIG. 7 illustrates a second attached configuration of two of the three modular units in accordance with the exemplary embodiment.
Figure 8:
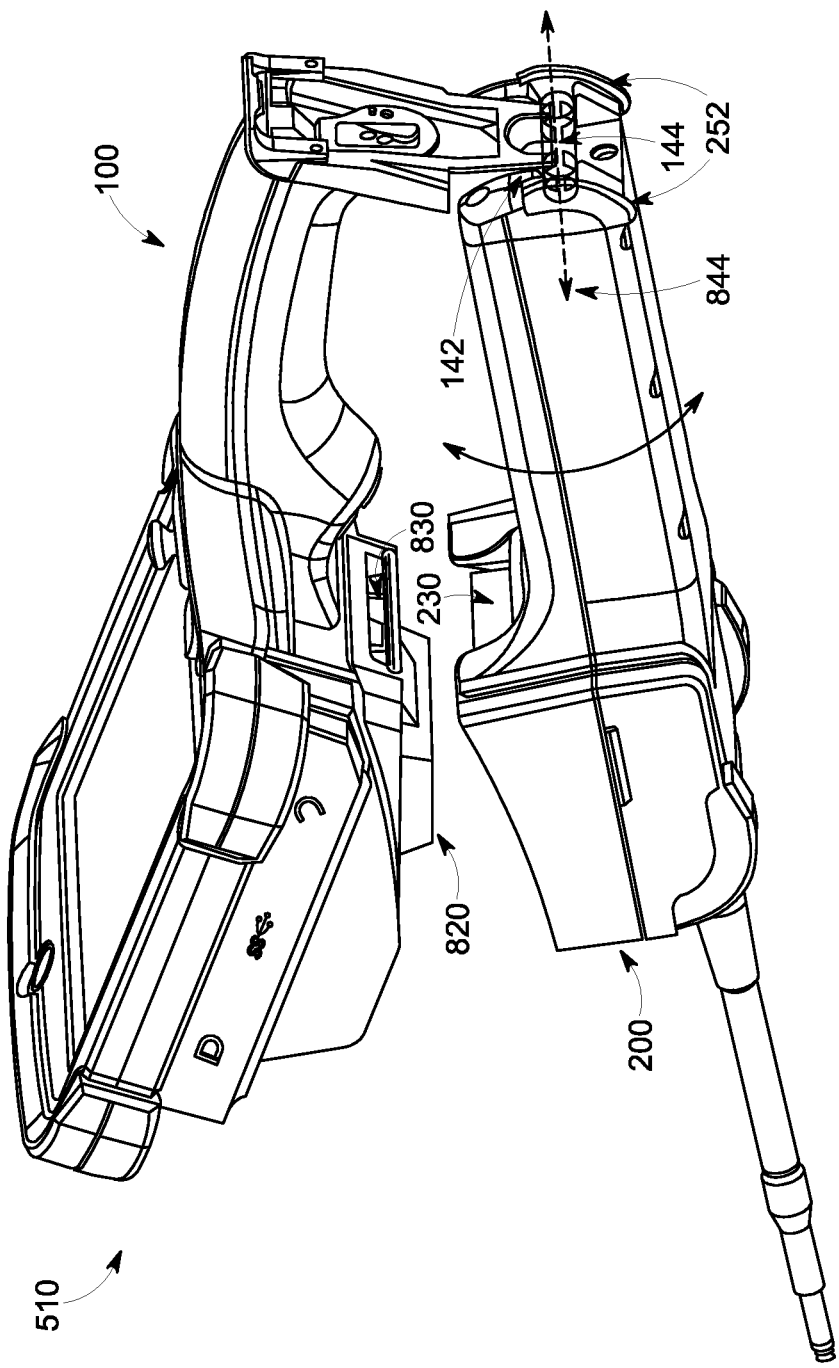
FIG. 8 illustrates a second free pivoting configuration of two of the three modular units in accordance with the exemplary embodiment.

FIG. 7 illustrates a second attached configuration 410 where the handset unit 100 and inspection unit 200 are attached in accordance with the exemplary embodiment. In this configuration, the handset unit 100 and inspection unit 200 may be secured together by mechanical connectors, such as first latch catch 830 and first latch 230 (as seen in FIG. 8) and by the engagement of pivot rod seat 254 with pivot rod 144. In this non-limiting example, the handle 130 and extension 240 are configured to provide a sufficient opening for a user to grip the handle 130 and operate the trigger input 125.

FIG. 8 illustrates a second free pivoting configuration 510 in accordance with the exemplary embodiment. The second free pivoting configuration 510 enables the inspection unit 200 to rotate about an axis of rotation, such as axis 844, which is defined by the pivot rod 144 of handset unit 100. Thus, the pivot rod 144 provides a rotational center point. In this non-limiting example, the inspection unit 200 may be matched (or linked) with the pivot rod 144 of handset unit 100 in an orientation which places the inspection unit 200 and handset unit 100 in the second free pivoting configuration 510.

If the inspection unit 200 is rotated over a range of motion into contact with the handset unit 100, the first latch catch 830 and first latch 230 will align and mate such that the handset unit 100 and inspection unit 200 assume the second attached configuration 410 in FIG. 7. Likewise, the first connector 820 and the first matching connector 220 will also align and mate.

Using the pivot rod 144 to define the axis of rotation (axis 844) ensures the inspection unit 200 is moving in the correct manner so that the inspection unit 200 properly interfaces with the handset unit 100, for example, using first latch catch 830, first latch 230, first connector 820 and the first matching connector 220. The locations of the element 830, 230, 820, 220 on the modular units 100, 200, (as may be defined by the distance of the element 830, 230, 820, 220 from the axis 844) ensure they are properly located/aligned to mate when the handset unit 100 and inspection unit 200 are brought into contact using the rotational motion.

Figure 9:
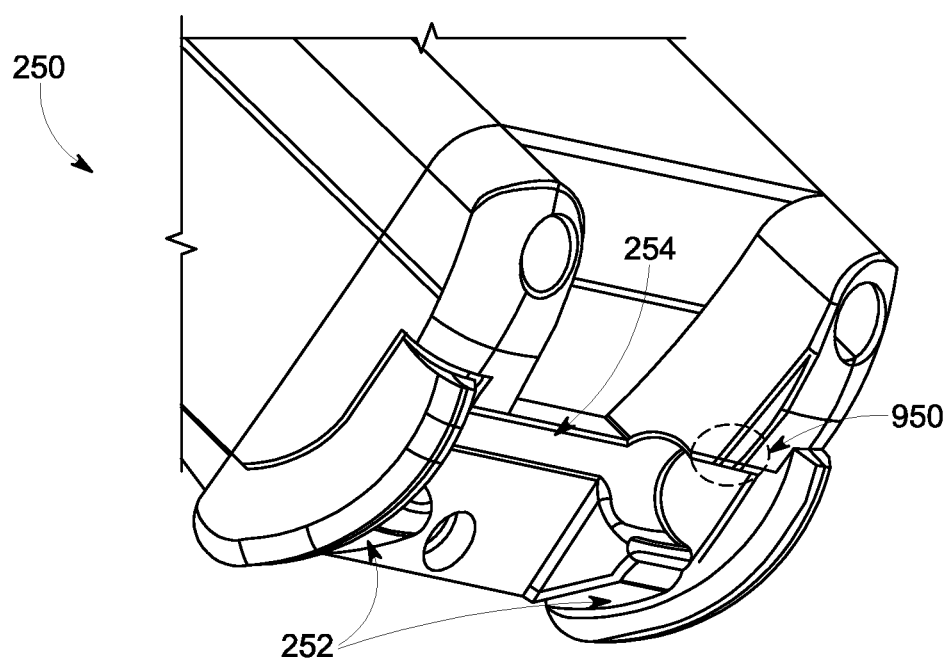
FIG. 9 shows a receiver portion of the second modular unit in accordance with the exemplary embodiment.

Turning to the receiver 250 of the inspection unit 200, as shown in FIG. 9, the pivot rod seat 254 is defined by a semi-circular opening in the pivot rod guides 252. This opening includes a flattened surface 950 which funnels/aligns the pivot rod 144 into the pivot rod seat 254 when mating the inspection unit 200 with the pivot rod 144.

The inspection unit 200 may be mated (or linked) with the pivot rod 144 of the handset unit 100 by moving the receiver 250 of the inspection unit 200 so that the pivot rod 144 is received in the pivot rod seat 254. This places the inspection unit 200 and the handset unit 100 in the second free pivoting configuration 510 of FIG. 8.

Figure 10:
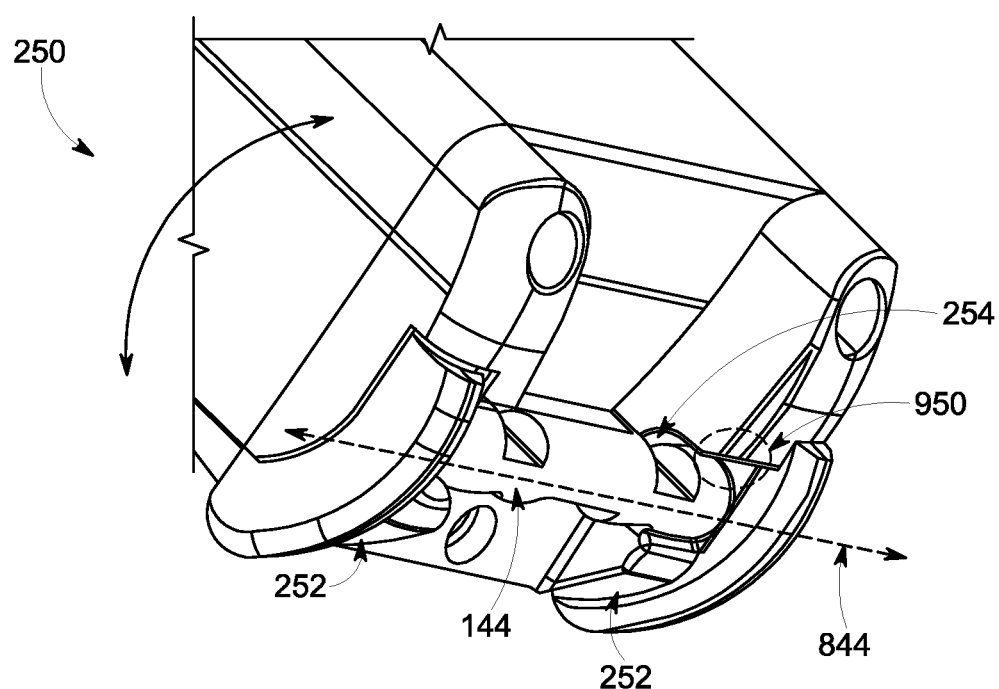
FIG. 10 demonstrates the receiver portion of the second modular unit with the pivot rod of the first modular unit in accordance with the exemplary embodiment.

FIG. 10 demonstrates the receiver 250 mated with the pivot rod 144 of the handset unit 100. As shown, the pivot rod seat 254 of the pivot rod guides 252 mates with a portion of the pivot rod 144, such as the ends of the pivot rod 144. In this arrangement, the pivot rod seat 254 provides a smooth surface that can rotate around the pivot rod 144 when the inspection unit 200 is rotated. The pivot rod guides 252 also prevent the pivot rod 144 from moving laterally along the axis 844. Restricting lateral movement along the axis 844 further helps ensure the modular units 100, 200 are properly aligned.

The inspection unit 200 may be detached (or unlinked) from the handset unit 100 by moving the inspection unit 200 out of contact with the handset unit 100 (into the second free pivoting configuration 510 of FIG. 8). In this non-limiting example, this may include operating the first latch 230 to disconnect from (or un-mate with) the first latch catch 830. Once in the second free pivoting configuration 510, the handset unit 100 may be moved perpendicular to the axis 844 so that the pivot rod 144 exits the pivot rod seat 254.

Figure 11:
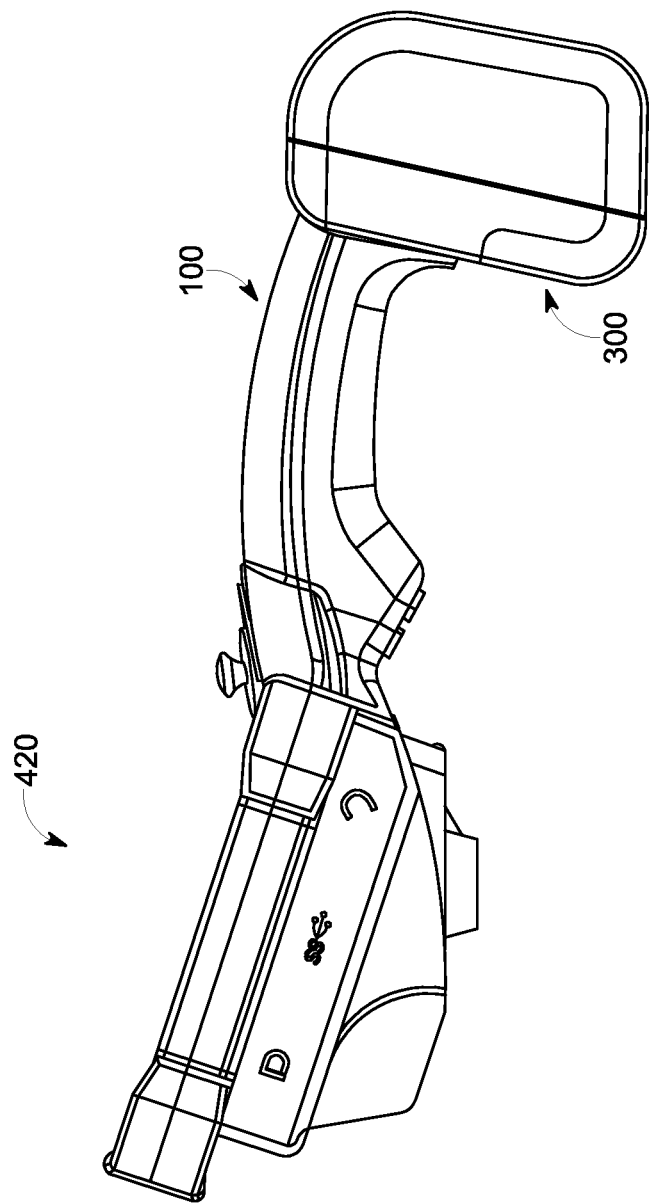
FIG. 11 illustrates a third attached configuration of two of the three modular units in accordance with the exemplary embodiment.

FIG. 11 illustrates a third attached configuration 420 where the handset unit 100 and battery unit 300 are attached in accordance with the exemplary embodiment. In this configuration, the handset unit 100 and battery unit 300 may be secured together by mechanical connectors, such as second latch catch 148 and second latch 310 (as seen in FIG. 12) and by the engagement of at least hook 340 with pivot rod 144.

Figure 12:
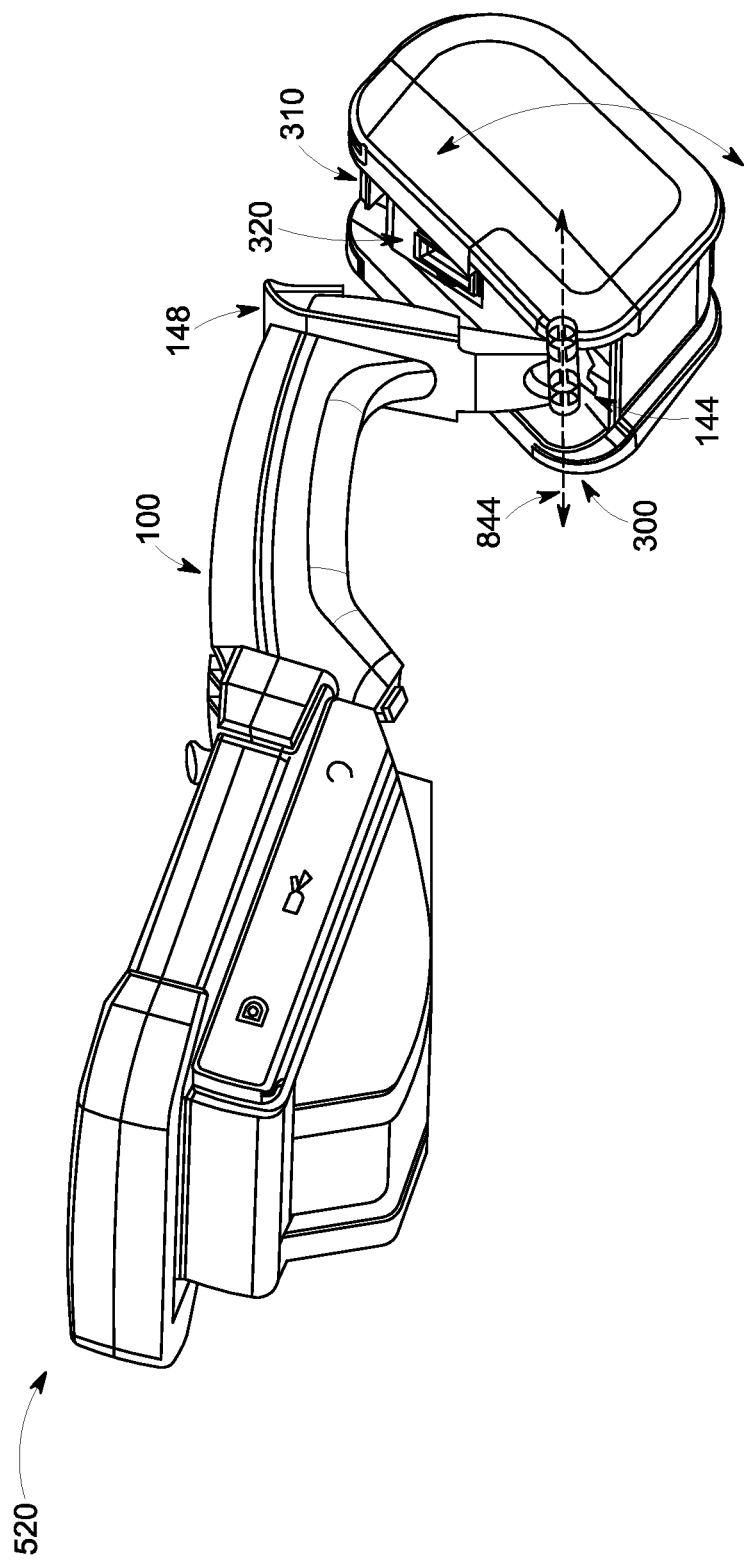
FIG. 12 illustrates a third free pivoting configuration of two of the three modular units in accordance with the exemplary embodiment.

FIG. 12 illustrates a third free pivoting configuration 520 in accordance with the exemplary embodiment. The third free pivoting configuration 520 enables the battery unit 300 to rotate about an axis of rotation, such as axis 844, which is defined by the pivot rod 144 of handset unit 100. In this non-limiting embodiment, the battery unit 300 may be mated (or linked) with the pivot rod 144 of the handset unit 100 in an orientation which places the battery unit 300 and handset unit 100 in the third free pivoting configuration 520.

If the battery unit 300 is rotated over a range of motion into contact with the handset unit 100, the second latch catch 148 and second latch 310 will align and mate such that the handset unit 100 and battery unit 300 assume the third attached configuration 420 of FIG. 11. Likewise, the second connector 146 and the second matching connector 320 will also align and mate. In this non-limiting embodiment, both the inspection unit 200 and the battery unit 300 may be attached to the handset unit 100 using similar, rotational motions. This speeds up the familiarization process of the user since various modular units can be attached using analogous actions.

Again, using the pivot rod 144 to define the axis of rotation (axis 844) ensures the battery unit 300 is moving in the correct manner so that the battery unit 300 properly interfaces with the handset unit 100, for example, using the second latch catch 148, the second latch 310, the second connector 146 and the second matching connector 320. The locations of the element 148, 310, 146, 320 on the modular units 100, 300, (as may be defined by the distance from the axis 844) ensure the element 148, 310, 146, 320 are properly located/aligned to mate when the handset unit 100 and battery unit 300 are brought into contact using the rotational motion.

Figure 13:
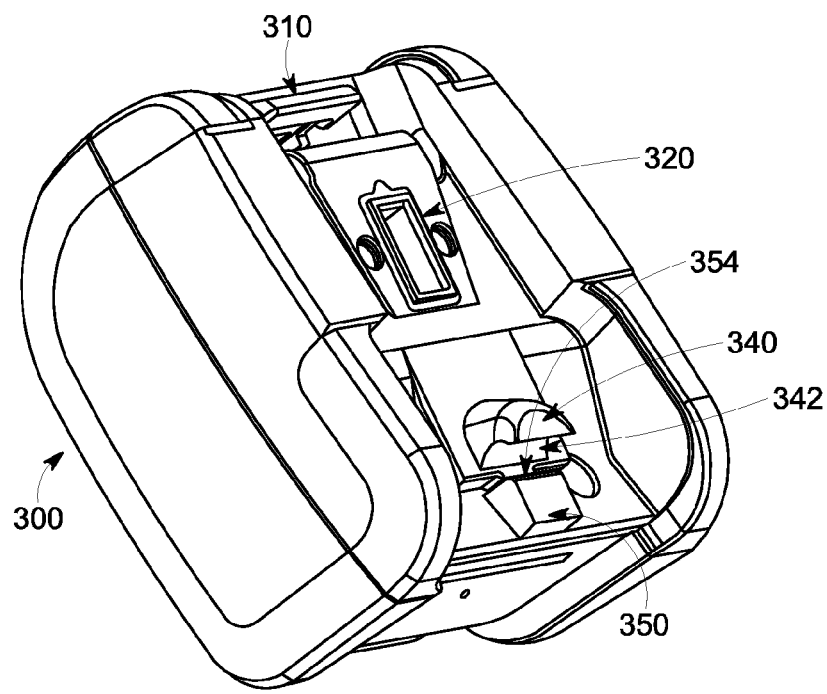
FIG. 13 shows the third modular unit in accordance with the exemplary embodiment.

FIG. 13 shows the battery unit 300 in accordance with the exemplary embodiment. As shown, the hook 340 defines a pivot rod recess 342. The stop 350 includes a stop inner surface 354 which faces the hook 340 and further defines the pivot rod recess 342. When in the third attached configuration 420 the stop inner surface 354 may be parallel with the pivot rod slot surface 646 shown in FIG. 4.

The battery unit 300 may be mated (or linked) with the pivot rod 144 of the handset unit 100 by moving the hook 340 of the battery unit 300 so that the pivot rod 144 is received in the pivot rod recess 342 and the hook 340 is received in the pivot rod slot 644. This places the battery unit 300 and the handset unit 100 in the third free pivoting configuration 520 of FIG. 12.

Figure 14:
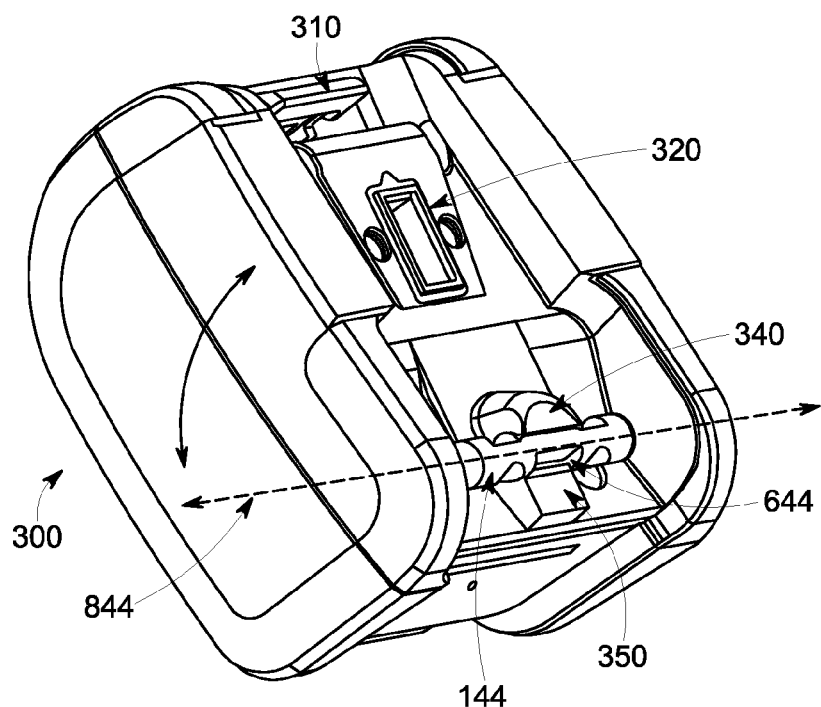
FIG. 14 demonstrates the third modular unit with the pivot rod of the first modular unit in accordance with the exemplary embodiment.

FIG. 14 demonstrates the battery unit 300 mated with the pivot rod 144 of the handset unit 100. In this arrangement, a portion of the pivot rod 144, such as the center of the pivot rod 144, rests in the pivot rod recess 342. The hook 340 can rotate around the pivot rod 144 when the battery unit 300 is rotated. The stop 350 may include a chamfered edge so that the pivot rod 144 may be easily maneuvered into the pivot rod recess 342.

The stop 350 also prevents the pivot rod 144 from moving laterally along the axis 844. By restricting lateral position along the axis 844, the modular units 100, 300 are certain to be properly aligned for attaching once linked. Additionally, the mounting plate opening 640 may be configured to fit the hook 340. This further limits the relative lateral positions of the handset unit 100 and the battery unit 300.

The battery unit 300 may be detached (or unlinked) from the handset unit 100 by moving the battery unit 300 out of contact with the handset unit 100 (into the third free pivoting configuration 520 of FIG. 12). In this non-limiting example, this may include operating the second latch 310 to disconnect from (or un-mate with) the second latch catch 148. Once in the third free pivoting configuration 520, the battery unit 300 may be moved perpendicular to the axis 844 so that the pivot rod 144 exits the pivot rod recess 342. This may include rotating the battery unit 300 a sufficient degree so that the pivot rod slot surface 646 (shown in FIG. 4) is more parallel to the top of the stop 350. The battery unit 300 may then be moved along a plane defined by the pivot rod slot surface 646 in the direction perpendicular to the axis 844.

Figure 15:
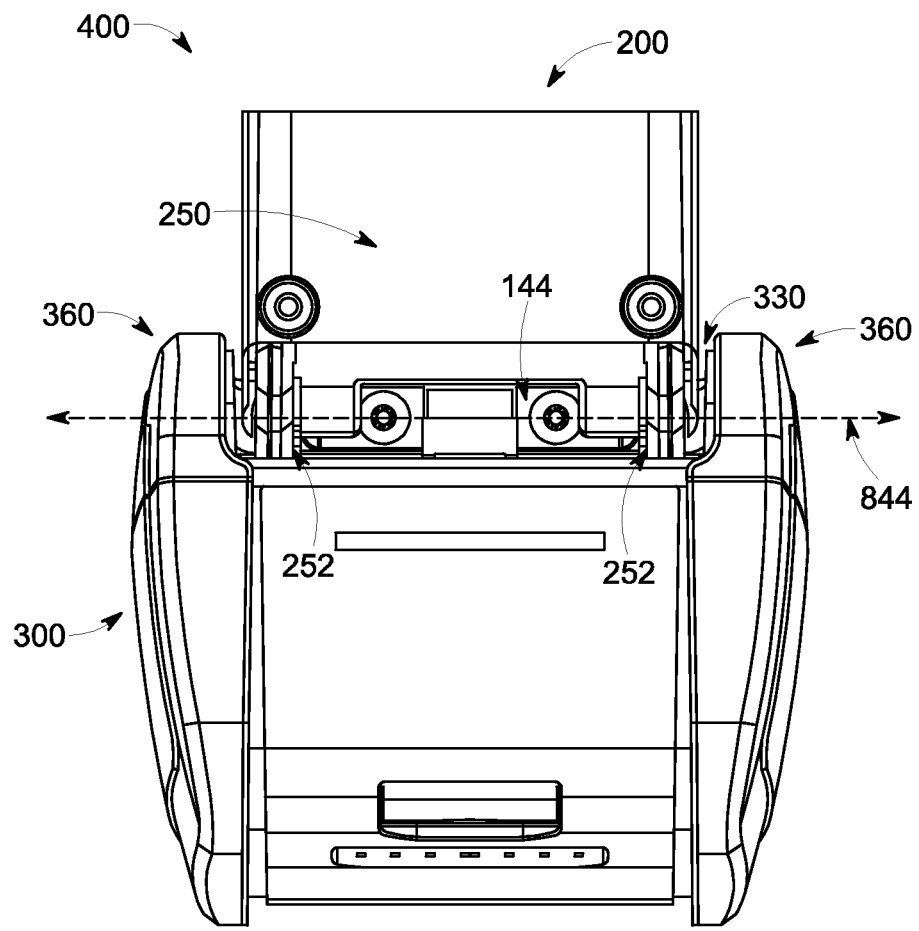
FIG. 15 illustrates another view of the first attached configuration of the three modular units in accordance with the exemplary embodiment.

FIG. 15 illustrates another view of the first attached configuration 400 of the three modular units 100, 200, 300 in accordance with the exemplary embodiment. As shown, the inspection unit 200 and the battery unit 300 are linked with the pivot rod 144 which is nearly hidden from view.

The receiver 250 of the inspection unit 200 is disposed in the modular unit seat 330 of battery unit 300. This places the receiver 250 between the modular unit guides 360. As both the inspection unit 200 and the battery unit 300 prevent the pivot rod 144 from moving laterally along the axis 844, the inspection unit 200 and the battery unit 300 are, thus, restricted from moving laterally by extension. Accordingly, the modular unit guides 360 also serve to align the pivot rod guides 252 of inspection unit 200 with the pivot rod 144 when connecting the inspection unit 200 to the third attached configuration 420 or to align the hook 340 and stop 350 of battery unit 300 with the pivot rod 144 when connecting the battery unit 300 to the second attached configuration 410.

Because the inspection unit 200 mates with a different portion of the pivot rod 144 than the battery unit 300 (see FIGS. 10, 14 and 15) the inspection unit 200 may be mated with the pivot rod 144 when the battery unit 300 and handset unit 100 are in either the third attached configuration 420 or the third free pivoting configuration 520 as well as when the handset unit 100 is detached from the battery unit 300. Likewise, the battery unit 300 may be mated with the pivot rod 144 when the handset unit 100 is detached from the inspection unit 200 as well as when the handset unit 100 and the inspection unit 200 are in the second attached configuration 410 or in the second free pivoting configuration 510.

Based on the foregoing various exemplary embodiments provide a method, systems and apparatus to selectively attach/detach individual modular units of a modular device using rotational motion. An advantage that may be realized in the practice of some embodiments of the described methods, systems and apparatus is to ensure proper alignment of the individual modular units. Another advantage that may be realized is the ability to independently attach and/or remove a single modular unit without forcing a complete disassembly of the composite modular device. A further advantage that may be realized is that since the various modular units (or sub-assemblies) are well-aligned, the modular units may be designed to form a tighter fit giving a cleaner look. Another advantage that may be realized is that, by using a common connection point (such as pivot rod 144), the modular device can be made with less parts with a reduced weight.

Figure 16:
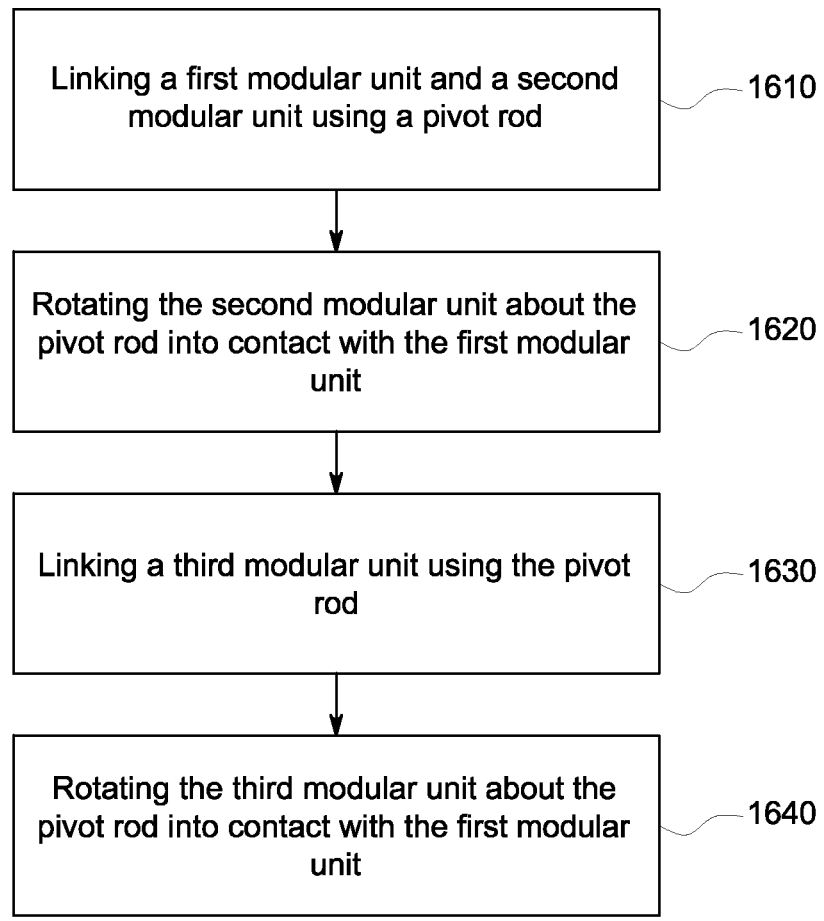
FIG. 16 is a logic flow diagram that illustrates the operation of an exemplary method in accordance with various exemplary embodiments.

FIG. 16 is a logic flow diagram that illustrates the operation of a method, in accordance with exemplary embodiments. The various blocks shown in FIG. 16 may be viewed as method steps. In accordance with these exemplary embodiments the method performs, at Block 1610, a step of linking a first modular unit and a second modular unit using a pivot rod. The first modular unit includes a first connector (such as an electrical connector as a non-limiting example) and the second modular unit includes a second connector. A step of rotating the second modular unit about an axis of rotation defined by the pivot rod into contact with the first modular unit is performed by the method at Block 1620. The second connector is configured to align with the first connector when the second modular unit is rotated about the axis of rotation defined by the pivot rod into contact with the first modular unit. The method performs, at Block 1630, a step of linking a third modular unit using the pivot rod. The third modular unit includes a third connector (such as an electrical connector as a non-limiting example) and the first modular unit further includes a fourth connector. A step of rotating the third modular unit about the axis of rotation defined by the pivot rod into contact with the first modular unit is performed by the method at Block 1640. The third connector is configured to align with the fourth connector when the third modular unit is rotated about the axis of rotation defined by the pivot rod into contact with the first modular unit. The second modular unit and the third modular unit are configured to be independently removable.

In a further exemplary embodiment, the second connector 146 and second matching connector 320 are configured to supply power from the battery unit 300 to the handset unit 100.

In another exemplary embodiment, the first connector 820 and first matching connector 220 are configured to supply power from the handset unit 100 to the inspection unit 200. The first connector 820 and first matching connector 220 may also be configured to transfer high-speed data and control signals.

In a further exemplary embodiment, the pivot rod 144 is securely attached to the handset unit 100 (via the mounting plate 140). Alternative, the pivot rod 144 and mounting plate 140 may be integrated into the handset unit 100 as a part of the housing.

In a further exemplary embodiment, various elements (146, 148, 220, 230, 310, 320, 820, 830) may be configured to mate using a rotational motion (as compared to, e.g., a linear motion), as a non-limiting example, interfacing surfaces of the element (146, 148, 220, 230, 310, 320, 820, 830) may be curved. This curvature may be based, at least in part, on the distance of the surface from the axis 844, such as where a surface located closer to the axis 844 may be more curved than a surface located farther from the axis 844 for example.

In another exemplary embodiment, the rotational motion used to mate various elements (146, 148, 220, 230, 310, 320, 820, 830) causes elements of a connector (such as metal pads as a non-limiting example) to move or "wipe" across a surface of the mating connector as it comes into final position (latched on). This ensures the metal pad is clean and provided a more reliable connection.

In the above exemplary embodiment, various connectors are described as mechanical connectors (148, 310, 230, 830) and electrical connectors (146, 320, 820, 220) as non-limiting examples. In additional exemplary embodiments, electrical, mechanical, hydraulic, inductive and pneumatic connectors may be used. Furthermore, a connector may provide multiple types of connection, for example, a single connector may provide both a mechanical connection and a hydraulic connection.

The mechanical connectors, such as second latch catch 148, second latch 310, first latch 230 and first latch catch 830, may be of any type suitable to the local technical environment and may be implemented using any suitable technology, such as spring latches, magnetic fasteners, sliding locks, etc.

The electrical connectors, such as second connector 146, second matching connector 320, first connector 820 and first matching connector 220, may be of any type suitable to the local technical environment and may be implemented using any suitable technology, such as electrical pin connectors, magnetic induction connectors, etc. In a further exemplary embodiment, the pivot member may be a set of cylindrical nubs on the sides of a portion of the hand set unit 100. In another embodiment the pivot member may be a concave receiver on the hand set unit 100 which is configured to receive a convex mating surface on another modular unit, such as the inspection unit 200.

This written description uses examples to disclose the invention, including the best mode, and also to enable any person skilled in the art to practice embodiments of the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

In view of the foregoing, various embodiments provide a way to connect modular units using a rotational motion. A technical effect is to help align the modular units for connection and enable easy replacement of individual modular units without disassembling the entire combination.

An exemplary embodiment provides an apparatus for selectively attaching/detaching individual modular units of the modular device using rotational motion. The apparatus includes a first modular unit having a pivot member and a first connector. The apparatus also includes a second modular unit having a second connector and a first mating point. The first mating point is configured to fit a first portion of the pivot member. The second connector is configured to align with the first connector when the second modular unit is rotated about an axis of rotation defined by the pivot member into contact with the first modular unit.

In a further exemplary embodiment of the apparatus above, the first connector is a first electrical connector and the second connector is a second electrical connector. The first modular unit includes a first mechanical connector and the second modular unit includes a second mechanical connector. The second mechanical connector is configured to align with the first mechanical connector when the second modular unit is rotated about the axis of rotation defined by the pivot member into contact with the first modular unit. The first mechanical connector and the second mechanical connector attach when the second modular unit is rotated about the axis of rotation defined by the pivot member into contact with the first modular unit.

In another exemplary embodiment of any one of the apparatus above, the first mating point includes a male hook defining a recess configured to fit the first portion of the pivot member. The pivot member may be a pivot rod having a slot. The second modular unit may then include a stop configured to fit the slot and to prevent the pivot rod from moving along the axis of rotation when the first portion of the pivot rod is fit within the first mating point.

In a further exemplary embodiment of any one of the apparatus above, the first mating point includes a pivot member guide defining a seat configured to fit the first portion of the pivot member. The pivot member guide may prevent the pivot member from moving along the axis of rotation when the first portion of the pivot member is fit within the first mating point.

In another exemplary embodiment of any one of the apparatus above, the apparatus also includes a third modular unit having a third connector and a second mating point. The second mating point is configured to fit a second portion of the pivot member. The first modular unit also includes a fourth connector. The third connector is configured to align with the fourth connector when the third modular unit is rotated about the axis of rotation defined by the pivot member into contact with the first modular unit. The second modular unit and the third modular unit may be configured to be rotated independently. The second modular unit may include a modular unit guide defining a seat configured to fit a portion of the third modular unit. The modular unit guide may prevent the third modular unit from moving along the axis of rotation when the third modular unit is fit within the modular unit guide.

In a further exemplary embodiment of any one of the apparatus above, the first modular unit is configured to be powered by the second modular unit.

In another exemplary embodiment of any one of the apparatus above, the second modular unit is configured to be powered by the first modular unit.

In a further exemplary embodiment of any one of the apparatus above, the first modular unit is a handset unit and the handset unit which includes a computer processor, an input and an output. The second modular unit may be a battery unit or a sensor unit.

Another exemplary embodiment provides an apparatus for selectively attaching/detaching individual modular units of the modular device using rotational motion. The apparatus includes a first modular unit, the first modular unit having a pivot member and a first connector, and a second modular unit having a second connector and a first mating point. The first mating point is configured to fit a first portion of the pivot member. The apparatus also includes a third modular unit having a second mating point. The second mating point is configured to fit a second portion of the pivot member. The second connector is configured to align with the first connector when the second modular unit is rotated about an axis of rotation defined by the pivot member into contact with the first modular unit and the third modular unit is configured to be rotated about the axis of rotation defined by the pivot member. The second modular unit and the third modular unit are configured to be independently removable.

In a further exemplary embodiment of the apparatus above, the second modular unit and the third modular unit are configured to be rotated independently.

In another exemplary embodiment of any one of the apparatus above, the first portion of the pivot member is different from the second portion of the pivot member.

A further exemplary embodiment provides a method for selectively attaching/detaching individual modular units of the modular device using rotational motion. The method includes linking a first modular unit and a second modular unit using a pivot member. The first modular unit includes a first connector and the second modular unit includes a second connector. The second modular unit is rotated about an axis of rotation defined by the pivot member into contact with the first modular unit. The second connector is configured to align with the first connector when the second modular unit is rotated about the axis of rotation defined by the pivot member into contact with the first modular unit. The method also includes linking a third modular unit using the pivot member. The third modular unit includes a third connector and the first modular unit also includes a fourth connector. The third modular unit is rotated about the axis of rotation defined by the pivot member into contact with the first modular unit. The third connector is configured to align with the fourth connector when the third modular unit is rotated about the axis of rotation defined by the pivot member into contact with the first modular unit. The second modular unit and the third modular unit are configured to be independently removable.

In another exemplary embodiment of the method above, in a first attached configuration, the first modular unit and the second modular unit are in contact and the first modular unit and the third modular unit are in contact. The method also includes, in the first attached configuration, rotating the second modular unit about the axis of rotation defined by the pivot member out contact with the first modular unit and unlinking the first modular unit and the second modular unit while the first modular unit and the third modular unit remain in contact. While the first modular unit and the third modular unit remain in contact, a fourth modular unit may be linked using the pivot member. This fourth modular unit includes a fifth connector. The fourth modular unit may be rotated about the axis of rotation defined by the pivot member into contact with the first modular unit. The fourth connector may be configured to align with the first connector when the fourth modular unit is rotated about the axis of rotation defined by the pivot member into contact with the first modular unit. The fourth modular unit and the third modular unit may also be configured to be independently removable.

A further exemplary embodiment provides an apparatus for selectively attaching/detaching from a modular device using rotational motion. The apparatus includes a mating point configured to fit a first portion of a pivot member connected to a modular device and a first connector configured to align with a second connector on the modular device when the apparatus is rotated about an axis of rotation defined by the pivot member into contact with the modular device.

In another exemplary embodiment of the apparatus above, the first connector is a first electrical connector and the second connector is a second electrical connector. The apparatus also includes a first mechanical connector configured to align with a second mechanical connector on the modular device when the apparatus is rotated about the axis of rotation defined by the pivot member into contact with the modular device. The first mechanical connector is also configured to attach with the second mechanical connector when the apparatus is rotated about the axis of rotation defined by the pivot member into contact with the modular device.

In a further exemplary embodiment of the apparatus above, the apparatus also includes a modular unit guide defining a seat configured to fit a portion of a modular unit.

Various embodiments in accordance with the invention are inclusive of combinations of the aspects or other embodiments described herein. References to "a particular aspect" or "embodiment" and the like refer to features that are present in at least one aspect of the invention. Separate references to "an aspect" or "particular aspects" or "embodiments" or the like do not necessarily refer to the same aspect or aspects; however, such aspects are not mutually exclusive, unless so indicated or as are readily apparent to one of skill in the art. The use of singular or plural in referring to "method" or "methods" and the like is not limiting. The word "or" is used in this disclosure in a non-exclusive sense, unless otherwise explicitly noted.

Various embodiments in accordance with the invention have been described in detail with particular reference to certain preferred aspects thereof, but it will be understood that variations, combinations, and modifications can be effected by a person of ordinary skill in the art within the spirit and scope of the invention. Examples of variations, combinations, and modifications that are intended to be within the scope of the claims are those having structural elements that do not differ from the literal language of the claims and those including equivalent structural elements with insubstantial differences from the literal language of the claims.

What is claimed is:

1. An apparatus comprising:
    a first modular unit comprising a pivot member and a first connector;
    a second modular unit comprising a second connector and a first mating point,
    wherein the first mating point is configured to fit a first portion of the pivot member and the second connector is configured to align with the first connector when the second modular unit is rotated about an axis of rotation defined by the pivot member into contact with the first modular unit; and
    a third modular unit comprising a third connector and a second mating point,
    wherein the second mating point is configured to fit a second portion of the pivot member, the first modular unit further comprises a fourth connector and the third connector is configured to align with the fourth connector when the third modular unit is rotated about the axis of rotation defined by the pivot member into contact with the first modular unit,
    wherein the second modular unit and the third modular unit are configured to be rotated independently about the pivot member and the second modular unit can be removed from the pivot member and the second modular unit and the third modular unit can be removed independently from the pivot member.

2. The apparatus of claim 1, wherein the first connector is a first electrical connector, the second connector is a second electrical connector, and the first modular unit further comprises a first mechanical connector,
    the second modular unit further comprises a second mechanical connector,
    the second mechanical connector is configured to align with the first mechanical connector when the second modular unit is rotated about the axis of rotation defined by the pivot member into contact with the first modular unit, and
    the first mechanical connector and the second mechanical connector attach when the second modular unit is rotated about the axis of rotation defined by the pivot member into contact with the first modular unit.

3. The apparatus of claim 1, wherein the first mating point comprises a male hook defining a recess configured to fit the first portion of the pivot member.

4. The apparatus of claim 3, wherein the pivot member comprises a pivot rod, where the pivot rod comprises a slot and the second modular unit comprises a stop configured to fit the slot and to prevent the pivot rod from moving along the axis of rotation when the first portion of the pivot rod is fit within the first mating point.

5. The apparatus of claim 1, wherein the first mating point comprises a pivot member guide defining a seat configured to fit the first portion of the pivot member.

6. The apparatus of claim 5, wherein the pivot member guide prevents the pivot member from moving along the axis of rotation when the first portion of the pivot member is fit within the first mating point.

7. The apparatus of claim 1, wherein the second modular unit comprises a modular unit guide defining a seat configured to fit a portion of the third modular unit.

8. The apparatus of claim 7 wherein the modular unit guide prevents the third modular unit from moving along the axis of rotation when the third modular unit is fit within the modular unit guide.

9. The apparatus of claim 1, wherein the first modular unit is configured to be powered by the second modular unit.

10. The apparatus of claim 1, wherein the second modular unit is configured to be powered by the first modular unit.

11. The apparatus of claim 1, wherein the first modular unit comprises a handset unit and the handset unit comprises a computer processor, an input and an output.

12. The apparatus of claim 11, wherein the second modular unit comprises one of: a battery unit and a sensor unit.

13. An apparatus comprising:
a first modular device configured with a pivot member, a first connector;
a second modular device configured to fit a first portion of the pivot member at a mating point and configured with a second connector; and
a third modular device configured to fit a second portion of the pivot member at a second mating point,
wherein the second modular device and the third modular device rotate independently about an axis of rotation defined by the pivot member.

14. The apparatus of claim 13, wherein the first connector is a first electrical connector, the second connector is a second electrical connector, and the first modular device further comprises a first mechanical connector configured to align with a second mechanical connector on the second modular device when the apparatus is rotated about the axis of rotation defined by the pivot member into contact with the first modular device, and
the first mechanical connector is further configured to attach with the second mechanical connector when the apparatus is rotated about the axis of rotation defined by the pivot member into contact with the first modular device.

15. The apparatus of claim 13, further comprising a modular unit guide defining a seat configured to fit a portion of a modular unit.

16. A method comprising:
linking a first modular unit and a second modular unit using a pivot member, wherein the first modular unit comprises a first connector and the second modular unit comprises a second connector;
rotating the second modular unit about an axis of rotation defined by the pivot member into contact with the first modular unit, wherein the second connector is configured to align with the first connector when the second modular unit is rotated about the axis of rotation defined by the pivot member into contact with the first modular unit;
linking a third modular unit using the pivot member, wherein the third modular unit comprises a third connector and the first modular unit further comprises a fourth connector; and
rotating the third modular unit about the axis of rotation defined by the pivot member into contact with the first modular unit, wherein, the third connector is configured to align with the fourth connector when the third modular unit is rotated about the axis of rotation defined by the pivot member into contact with the first modular unit,
wherein the second modular unit and the third modular unit are configured to be independently removable.

17. The method of claim 16, where, in a first attached configuration, the first modular unit and the second modular unit are in contact and the first modular unit and the third modular unit are in contact and the method further comprises:
in the first attached configuration, rotating the second modular unit about the axis of rotation defined by the pivot member out contact with the first modular unit; and
unlinking the first modular unit and the second modular unit while the first modular unit and the third modular unit remain in contact.

18. The method of claim 17, further comprising, while the first modular unit and the third modular unit remain in contact:
linking a fourth modular unit using the pivot member, wherein the fourth modular unit comprises a fifth connector; and
rotating the fourth modular unit about the axis of rotation defined by the pivot member into contact with the first modular unit, wherein, the fourth connector is configured to align with the first connector when the fourth modular unit is rotated about the axis of rotation defined by the pivot member into contact with the first modular unit,
wherein the fourth modular unit and the third modular unit are configured to be independently removable.

* * * * *